United States Patent [19]

Suzuki

[11] Patent Number: 4,847,809
[45] Date of Patent: Jul. 11, 1989

[54] IMAGE MEMORY HAVING STANDARD DYNAMIC RAM CHIPS

[75] Inventor: Seigo Suzuki, Tokyo, Japan

[73] Assignee: Kabushiki Kaisha Toshiba, Kawasaki, Japan

[21] Appl. No.: 883,733

[22] Filed: Jul. 9, 1986

[30] Foreign Application Priority Data

Jul. 10, 1985 [JP] Japan .................. 60-151976

[51] Int. Cl.$^4$ ............................ G11C 7/00; G11C 8/00
[52] U.S. Cl. .......................... 365/189.04; 365/230.04; 365/233; 365/236; 340/799
[58] Field of Search ............... 365/239, 240, 219, 221, 365/222, 189, 230, 233, 236; 340/750, 799, 800, 801

[56] References Cited

U.S. PATENT DOCUMENTS 4,433,394  2/1984  Torii et al. ......................... 365/221
4,513,372  4/1985  Ziegler et al. ..................... 365/230

FOREIGN PATENT DOCUMENTS 0049073  4/1980  Japan ................................ 365/233

OTHER PUBLICATIONS

Nikkei Electronics, Feb. 1985; pp. 219–239.

Primary Examiner—Joseph A. Popek
Assistant Examiner—Glenn A. Gossage
Attorney, Agent, or Firm—Foley & Lardner, Schwartz, Jeffery, Schwaab, Mack, Blumenthal & Evans

[57] ABSTRACT

An image memory comprising a plurality of memory cell columns for memorizing image data, common word lines for connecting memory cells of these memory cell columns, a scanner for sequentially designating memory cells of the column on the basis of a clock signal, a column address counter for counting the clock signal to output a column address signal, a write column selector responsive to the column address signal to select a memory cell column into which image data is written, a write buffer for writing image data into the designated memory cell of the memory cell column selected by the write column selector, a read column selector for selecting a memory cell column different from the memory cell column selected by the write column selector, and a read buffer for reading image data from the designated memory cells of the memory cell column selected by the read column selector. The image memory is capable of performing write and read operations at the same time. For performing refresh operation simultaneously with read/write operation, a read/write/refresh selector may be provided instead of a read/write selector provided in the column address counter. Further, for realizing write and read operation at the same time even when a write clock signal is different from a read clock signal, the memory cell columns may be divided into a plurality of memory cell column groups, e.g., odd and even memory cell groups.

16 Claims, 14 Drawing Sheets

PRIOR ART
FIG. 2
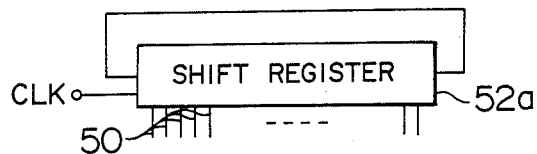
PRIOR ART
FIG. 3
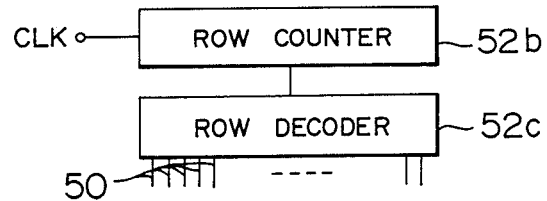
FIG. 8
|  | 1H | 2H | 3H | ---- | NH | (N+1)H | (N+2)H | ---- |
|---|---|---|---|---|---|---|---|---|
| COLUMN #1 | W | — | — |  | Ref | — | — |  |
| COLUMN #2 | R | W | — |  | — | Ref | — |  |
| COLUMN #3 | — | R | W |  | — | — | Ref |  |
|  |  |  |  |  |  |  |  |  |
| COLUMN #N | Ref | — | — |  | W | — | — |  |
| COLUMN #N+1 | — | Ref | — |  | R | W | — |  |
| COLUMN #N+2 | — | — | Ref |  | — | R | W |  |
|  |  |  |  |  |  |  |  |  |

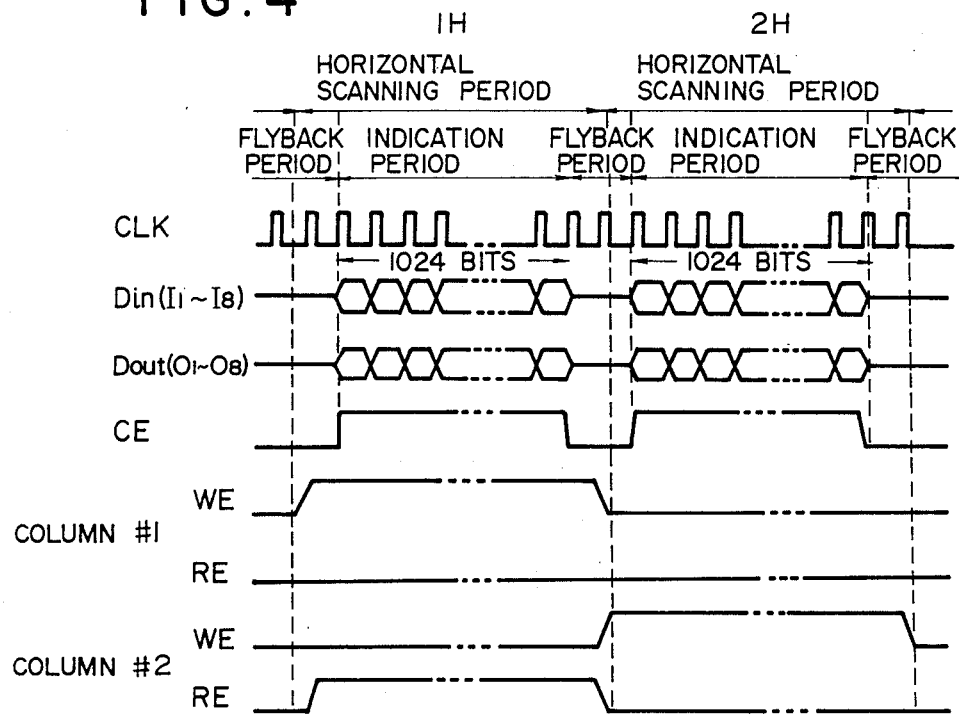

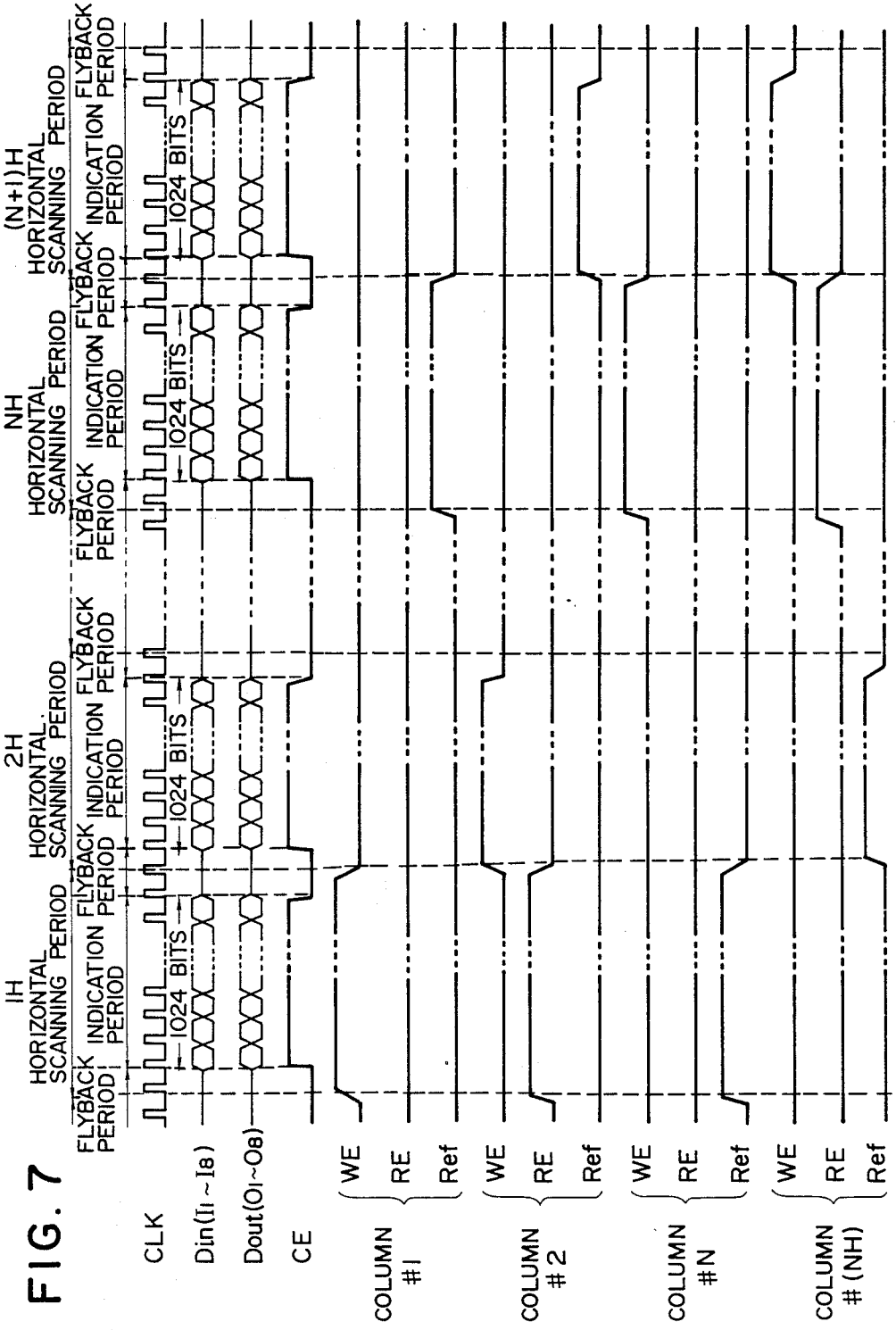

FIG. 15

|  | 1H | 2H | 3H | 4H | 5H | - - - - |
|---|---|---|---|---|---|---|
| COLUMN #1 | W | – | – | – | – | |
| COLUMN #3 | – | R | W | – | – | |
| ⋮ | | | | | | |
| COLUMN #K | Ref | – | – | – | – | |
| COLUMN #K+1 | – | – | Ref | – | – | |
| ⋮ | | | | | | |
| COLUMN #2 | R | W | – | – | – | |
| COLUMN #4 | – | – | R | W | – | |
| ⋮ | | | | | | |
| COLUMN #L | – | Ref | – | – | – | |
| COLUMN #L+1 | – | – | – | Ref | – | |
| ⋮ | | | | | | |

IMAGE MEMORY HAVING STANDARD DYNAMIC RAM CHIPS

BACKGROUND OF THE INVENTION

The present invention relates to an image memory for writing image data thereinto and reading it therefrom.

In recent years, MOS dynamic RAMs have still increasing capacity, and memory capacity per chip is increasing from the order of 64 K bits to 256 K bits. In the near future, products having a capacity of 1 M bits will be available. Accordingly as large capacity MOS dynamic RAMs have been thus put into practice, an attempt is made to use such MOS dynamic RAMS for image memories developed for handling extremely large quantities of data (see Nagami et al. "Image purpose serial input/output dynamic memory of 320 rows by 700 columns configuration for a field memory used in Television or VTR", pp 219~239 in NIKKEI ELECTRONICS, Feb. 11, 1985).

Referring to FIG. 18, there is shown an example of a conventional image memory in which a standard dynamic RAM operable in random access mode is used. In this example, a resolution of 6 bits and a sampling frequency of 4 fsc (fsc represents a color subcarrier wage frequency) are employed. An input video signal is converted into digital image data of 6 bit configuration by an analog-to-digital (A/D) converter circuit 10. Six bits constituting the image data are input to six S/P converters 11, respectively. Respective parallel image data converted by these S/P converter circuits 11 are written into corresponding number of RAMs 12 and are stored therein. Then, respective parallel image data read from the RAMs are converted into serial data of 6 bits by P/S converter circuits 13. These serial data are converted into an analog signal by a digital-to-analog (D/A) converter circuit 14. The analog video signal thus obtained is output from the D/A converter circuit 14. A timing control circuit 15 functions to control operation timings of the A/D converter circuit 10, the S/P converter circuit 11, the RAM 12, the P/S converter circuit 13, and the D/A converter circuit 14.

Referring to FIG. 19, there is shown an example of an image memory specially configured for memorizing image data. A memory cell array for image storage is configured as a matrix having 320 rows and 700 columns. A data register 22 for holding data of 700 bits corresponding to one row is provided through a data transfer gate 21. Thus, serial data of one horizontal scanning period is input to the data register 22 and output therefrom. Data transfer between the memory cell array 20 and the data register 22 is performed so that data of 700 bits is transferred at a time therebetween by making use of the data transfer gate 21. The data of the data register 22 is outputted to a serial data bus 24 using a data transfer gate 23. To transfer gates of the data transfer gate 23, bits of a shift register 25 are connected, respectively. To the serial data bus 24, a data buffer 26 is coupled. By sequentially shifting storage contents of the shift register 25, parallel image data of the data register 22 is converted into serial image data so that the serial data thus obtained is outputted from the data buffer 26, and serial data from the data buffer 26 is converted into parallel data so that the parallel data thus obtained is inputted to the data register 22. Namely, the data register 22, the data transfer gate 23, the shift register 25 and the data buffer 26 constitute a P/S and S/P converter circuit.

In addition, for selecting the row address of the memory cell array 20, an up-down counter 27 for generating row address and a latch 28 are provided. Further, a refresh address counter 32 for selecting the row address subject to refresh operation is provided. These row addresses are selected by a multiplexer (MPX) 30. The buffer 31 and the decoder 32 provide an access to a specified row in the memory cell array 20.

The above-mentioned image memories require high speed S/P and P/S converter circuits for input/output of image data. The provision of these S/P and P/S converter circuits on a semiconductor substrate requires a large area, resulting in high cost.

The above-mentioned image memories are unable to read data from the memory cell while data is written into a memory cell, resulting in requirement of a break period. Moreover, for refreshing the memory cell, a break period is also required. Accordingly, the drawback with this image memory is that a unit of image data to be accessed at a time cannot be reduced.

In addition, where the image data is of plural bit configuration, it is required to enlarge peripheral circuitry in proportion to the number of bits. Accordingly, when the number of bits constituting the image data is increased, an area required for peripheral circuits is also increased, with the result that the entirety of the image memory becomes large and its cost becomes high.

SUMMARY OF THE INVENTION

An object of the present invention is to provide a low cost and general purpose image memory.

To achieve this object, an image memory according to the present invention comprises a plurality of memory cell columns, each of the columns comprising plural memory cells, for memorizing image data having a predetermined number of bits; common word lines for connecting corresponding memory cells of these memory cell columns to each other; scanning means for sequentially designating memory cells of the memory cell columns on the basis of the scanning operation using these common word lines in synchronism with a clock signal; a column address counter for counting the clock signal to output a column address signal; a write column selector for selecting a memory cell column into which image data is written on the basis of the column address signal from the column address counter; write means for writing image data into the memory cell designated by the scanning operation of the scanning means of the memory cell column selected by the write column selector; a read column selector for selecting a memory cell column different from the one selected by the write column selector on the basis of the column address signal from the column address counter; and read means for reading image data from the memory cell designated by the scanning operation of said scanning means of the memory cell column selected by the read column selector.

BRIEF DESCRIPTION OF THE DRAWINGS

In the accompanying drawings:

FIGS. 2 and 3 are schematic views illustrating examples of a row address scanning circuit used in the image memory shown in FIG. 1, respectively;

FIGS. 4 and 5 are a timechart and a table showing the operation of the image memory shown in FIG. 3, respectively.

FIGS. 7 and 8 are a timechart and a table showing the operation of the image memory shown in FIG. 6, respectively;

FIG. 15 is a table showing the operation of the image memory shown in FIG. 14;

DETAILED DESCRIPTION OF THE INVENTION

The present invention will be described in detail in connection with preferred embodiments with reference to attached drawings.

FIRST PREFERRED EMBODIMENT

Figure 1:
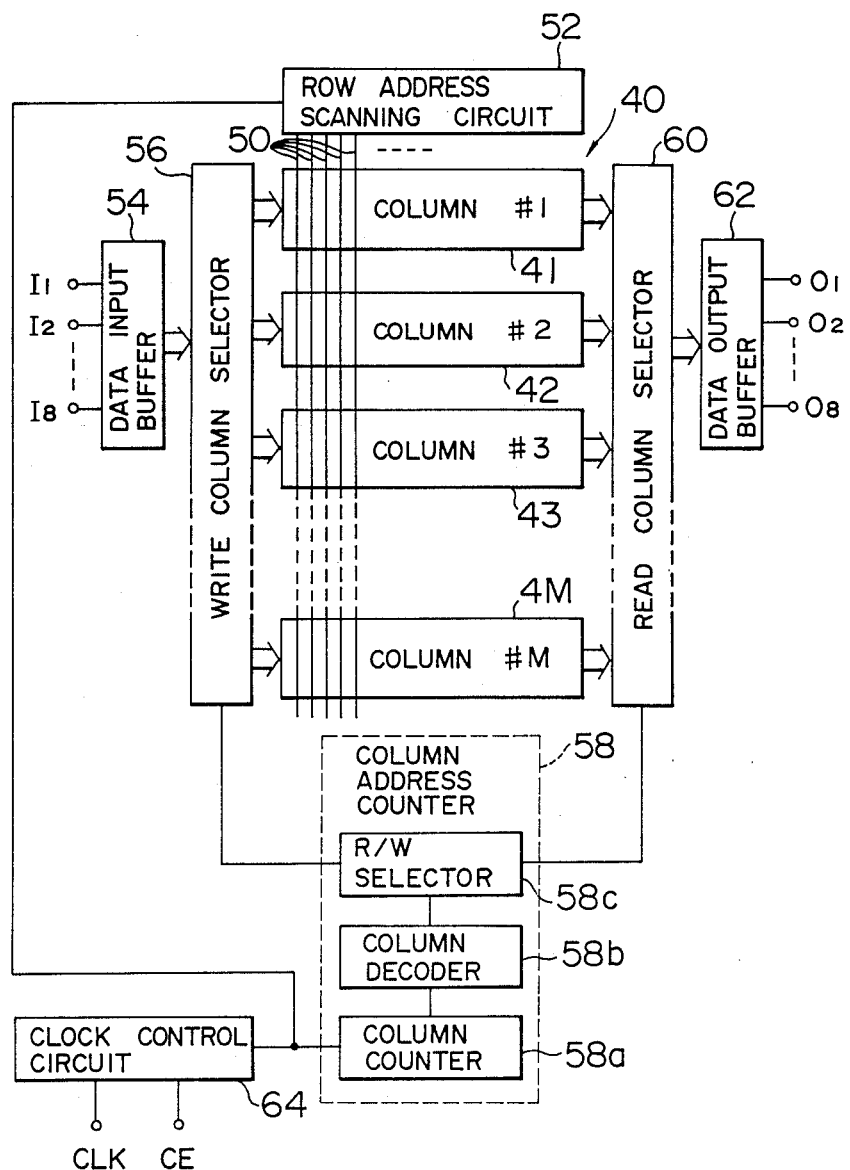
FIG. 1 is a block diagram illustrating a first preferred embodiment of an image memory according to the present invention.

A first preferred embodiment of an image memory according to the present invention is shown in FIG. 1. An image memory in this embodiment is provided with a memory cell array divided into M memory cell columns labeled 41 to 4M. All the memory cell columns 41 to 4M have the same configuration having 8 bits and 1,024 rows. In this embodiment, memory cells in each row of the respective memory cell columns 41 to 4M are connected by 1,024 common word lines 50. These common word lines 50 are connected to a row address scanning circuit 52. The row address scanning circuit 52 functions to sequentially designate the word lines 50 in synchronism with a clock signal CLK from a clock control circuit 64 to apply scanning operation to memory cells of the respective memory cell columns 41 and 4M.

Examples of the row address scanning circuit 52 are shown in FIGS. 2 and 3, respectively. The row address scanning circuit shown in FIG. 2 is constituted with a shift register 52a having 1,024 bits connected to the word lines 50, respectively. The row address scanning circuit shown in FIG. 2 has a configuration such that the most significant bit (MSB) and the least significant (LSB) are connected, thus to input data which has shifted from the LSB to the MSB for a second time. First is to store data of a bit train "100 . . . 0" into the shift register 52a to shift to the right bitwise in synchronism with the clock signal. Thus, the word lines are sequentially excited to apply scanning operation to memory cells of the respective memory cell columns 41 to 4M.

The row address scanning circuit shown in FIG. 3 is constituted with a row counter 52b and a row decoder 52c. The clock signal CLK is counted by the row counter 52b. The row decoder 52c decodes a count value of the row counter 52d to sequentially excite word lines connected to apply scanning operation to memory cells of the memory cell columns 41 to 4M.

Turning back to FIG. 1, the image memory further comprises a data input buffer 54 to which image data input terminals $I_1$ to $I_8$ are connected. The data input buffer 54 amplifies an image data signal of 8 bits input from the input terminals $I_1$ to $I_8$ so that its signal level is raised to a write enable level to output the image data signal thus amplified. This data input buffer 54 is connected to a write column selector 56. The write column selector 56 responds to a write select signal from a column address counter 58 to select a memory cell column to be written from the memory cell columns 41 to 4M to write the image data into the memory cell column selected.

A read column selector 60 connected to the respective memory cell groups 41 to 4M functions not only as a selector but also as a sense amplifier. The read column selector 60 responds to a read select signal from the column address counter 58 to select one of memory cell groups 41 to 4M to read the image data from a memory cell column selected. This read column selector 60 is connected to a data output buffer 62. The data output buffer 62 amplifies an image data signal from the read column selector 60 to output the image data signal amplified from output terminals $0_1$ to $0_8$.

A clock control circuit 64 inputs a clock signal CLK and a chip enable signal CE. The clock control circuit 64 outputs the clock signal CLK when the chip enable signal CE is at high level.

The column address counter 58 comprises a column counter 58a, a column decoder 58b and a read/write (R/W) selector 58c. The column counter 58a counts the clock signal CLK from the clock control circuit 64 to count up by one when pulses are input by the number of image data of one horizontal scanning period. A count value of the column counter 58a is decoded by the column decoder 58b. The R/W selector 58c responds to a decode signal from the column decoder 58b to output write and read select signals to the write column selector 56 and the read column selector 60, respectively.

The operation of the image memory according to this embodiment will be described with reference to FIGS. 4 and 5.

Initially, the column counter 58a is reset and its count value represents "0". When the count value of the column counter 58a is equal to "0", the R/W selector 58c operates to output therefrom a write select signal for selecting the memory cell column 41 labeled #1, and to output a read select signal for selecting the memory cell column 42 labeled #2. Thus, a write enable signal of the memory cell column 41 labeled #1 is raised to high level and read enable signal RE of the memory cell column 42 labeled #2 is also raised to high level. On the other hand, the row address scanning circuit 52 is also reset, thus exciting the word line 50 of the first row.

When the chip enable signal CE becomes high level, image data $D_{in}$ of 8 bits is input from the input terminals $I_1$ to $I_8$. This image data $D_{in}$ is written into a memory cell of the first row provided in the memory cell column 41 labeled #1 through the data input buffer 54 and the write column selector 56. At the same time, image data $D_{out}$ of 8 bits stored in a memory cell of the first row provided in the memory cell column 42 labeled #2 is read from the output terminals $O_1$ to $O_8$ of the data output buffer 62 through the read column selector 60. Then, when a next pulse of the clock signal is inputted, the row address scanning circuit 52 excites the word line 50 of the second row. As a result, image data $D_{in}$ from the input terminals $I_1$ to $I_8$ is written into a memory cell of the second row provided in the memory cell column 41 labeled #1 and image data stored in a memory cell of the second row provided in the memory cell column labeled #2 is read therefrom. Similarly, scanning operation is applied to memory cells of the memory cell columns 41 to 4M provided in the memory cell array 40 in synchronism with pulses of the clock signal, thus sequentially writing image data into the memory cell column 41 labeled #1 and sequentially reading image data from the memory cell column 42 labeled #2.

When write and read operations of the image data $D_{in}$ and $D_{out}$ of one horizontal scanning period are completed, the chip enable signal CE shifts to low level. The image memory according to the present invention has a configuration such that the memory cell columns 41 to 4M have 1,024 rows, thus making it possible to memorize up to 1,024 image data per one horizontal scanning period. Further, the column counter 58a counts up by one and its count value becomes "1". Thus, the column address counter 58 outputs a write select signal for selecting the memory cell column 42 labeled #2 to write column selector 56, and outputs a read select signal for selecting the memory cell column 43 labeled #3 to the read column selector 60. As a result, the write enable signal WE of memory cell column 41 labeled #1 changes to low level and the write enable signal WE of the memory cell column 42 labeled #2 shifts to high level. In addition, the read enable signal RE of the memory cell column 42 of labeled #2 becomes low level and the read enable signal RE of the memory cell column 43 labeled #3 becomes high level.

When the chip enable signal CE becomes high level, the write/read operation of image data $D_{in}$ and $D_{out}$ of the next horizontal scanning period is initiated. The image data $D_{in}$ is written into the memory cell column 42 labeled #2 and the image data $D_{out}$ is read from the memory cell column 43 labeled #3. When the write/read operation of the image data $D_{in}$ and $D_{out}$ is completed, the chip enable signal CE becomes low level and a count value of the column counter 58a is equal to "2". Then, image data $D_{in}$ is written into the memory cell column 43 labeled #3 and image data $D_{out}$ is read from the memory cell column 43. In a manner similar to the above, as shown in FIG. 5, image data $D_{in}$ are sequentially written into the memory cell columns 41 to 4M and at the same time image data $D_{out}$ are sequentially read from the memory cell columns 41 to 4M.

As stated above, the image memory according to the above-mentioned first embodiment functions to write and read the image data at the same time, thus enabling high speed write/read operation.

In the above-mentioned embodiment, a write amplifier for writing image data is assembled into the data input buffer 54. In addition, the write amplifier may be independently provided between the write column selector 56 and the memory cell columns 41 to 4M, or between the data input buffer 54 and the write column selector 56.

In the above-mentioned embodiment, a sense amplifier for reading the image data is assembled into the read column selector 60. In addition, the sense amplifier may be independently provided between the memory cell columns 41 to 4M and the read column selector 60, or between the read column selector 60 and the data output buffer 62.

Each memory cell constituting the memory cell array 40 may be of dynamic or static type. In the case of the dynamic memory, refresh operation is required every fixed cycle. In this instance, the setting is made such that write or read cycle is shorter than the refresh cycle, thereby eliminating the necessity of a special refresh operation.

In the above-mentioned embodiment, the write/read operation is sequentially applied to adjacent memory cell groups. However, such a write/read operation may be applied in other order.

SECOND PREFERRED EMBODIMENT

Figure 6:
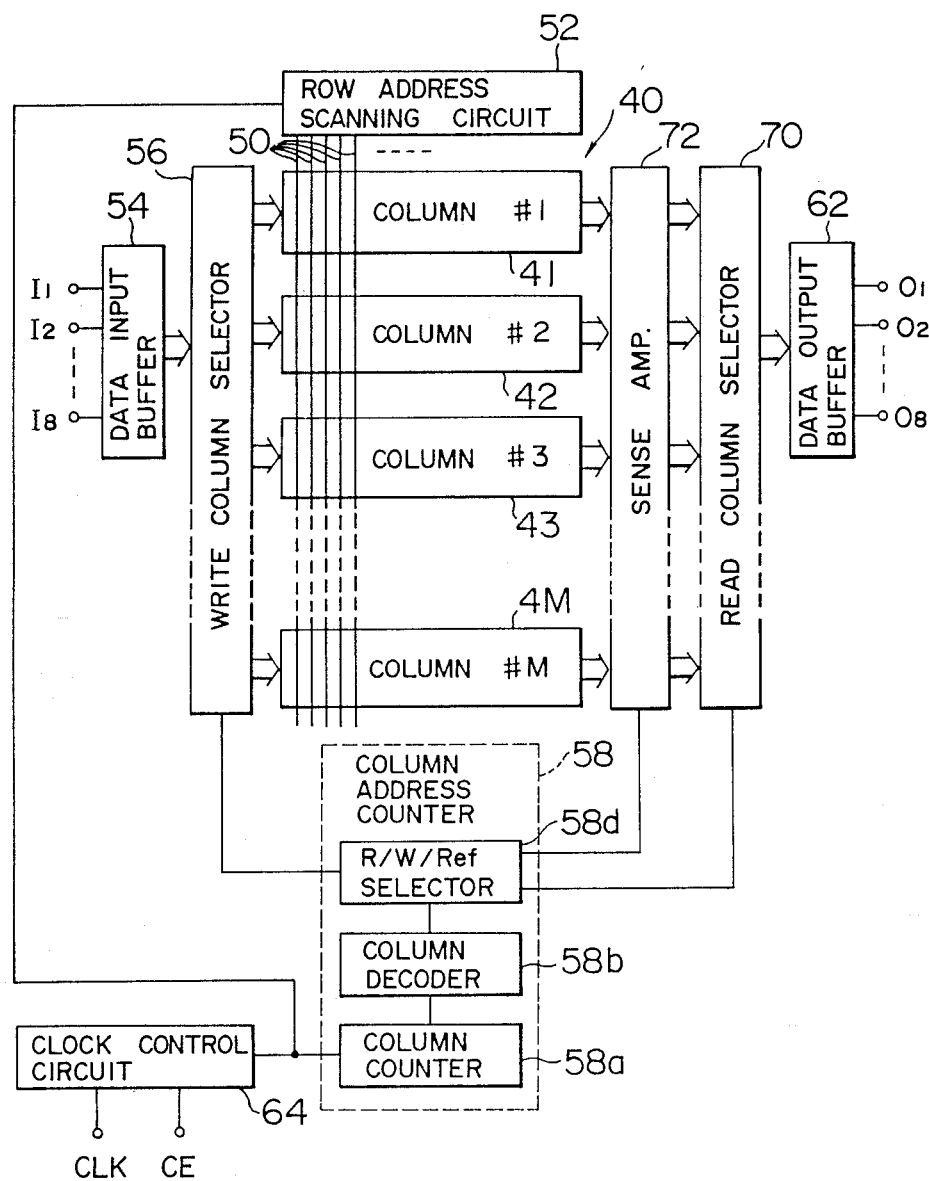
FIG. 6 is a block diagram illustrating a second preferred embodiment of an image memory according to the present invention.

A second preferred embodiment of an image memory according to the present invention is shown in FIG. 6. The image memory in this embodiment differs from the first embodiment shown in FIG. 1 in that an R/W/Ref selector 58d is provided instead of the R/W selector 58c of the column address counter 58. The R/W/Ref selector 58d functions to output not only read and write select signals but also a refresh select signal to select a memory cell group to be refreshed. A read select signal from the R/W/Ref selector 58d is output to a read column selector 56. The refresh select signal is output to a sense amplifier 72 provided between the read column selector 70 and the memory cell columns 41 to 4M. In this instance, refresh operation is performed by writing image data, which is obtained by allowing the sense amplifier 72 to sense and amplify image data read from a memory cell of a memory cell column selected by the refresh select signal, into the select memory cell column for a second time.

The operation of the image memory according to the second embodiment will be described with reference to FIGS. 7 and 8.

Initially, the column counter 58a is reset and its count value becomes "0". When the count value of the column counter 58a is equal to "0", the R/W/Ref selector 58d outputs a write select signal for selecting the memory cell column 41 labeled #1 to the write column selector 56, and outputs a read select signal for selecting the memory cell column 42 labeled #2 to the read column selector 60. Further, the R/W/Ref selector 58d outputs a refresh select signal for refreshing the memory cell column 4N of column #N (N=M/2) to the sense amplifier 72. Thus, the write enable signal WE of the memory cell column 41 labeled #1, the read enable signal RE of the memory cell column 42 labeled #2 and the refresh signal Ref of the memory cell column labeled #N all become high level. On the other hand, the row address scanning circuit 52 is also reset, thus exciting the word line 50 of the first row.

When the chip enable signal CE becomes high level, image data $D_{in}$ of 8 bits is input from the input terminals $I_1$ to $I_8$. This image data $D_{in}$ is written into a memory cell of the first row provided in the memory cell column 41 labeled #1 through the data input buffer 54 and the write column selector 56. At the same time, image data $D_{out}$ of 8 bits is read from the output terminals $0_1$ to $0_8$ of the data output buffer 62 through the read column selector 60. Further, at the same time, a memory cell of the first row provided in the memory cell column 4N labeled #N is refreshed. Then, when a next pulse of the clock signal CLK is input, the row address scanning circuit 62 excites the word line 50 of the second row. Accordingly, image data $D_{in}$ from the input terminals $I_1$ to $I_8$ is written into a memory cell of the second row provided in the memory cell column 41 labeled #1, image data $D_{out}$ is read from a memory cell of the second row provided in the memory cell column 42 labeled #2, and a memory cell of the second row provided in the memory cell column 4N labeled #N is refreshed. In a manner similar to the above, scanning operation is applied to memory cells of the respective memory cell columns 41 to 4M of the memory cell array 40 in synchronism with pulses of the clock signal CLK. Thus, image data $D_{in}$ is sequentially written into the memory cell column 41 labeled #1, image data $D_{out}$ is sequentially read from the memory cell column 42 of labeled #2, and the memory cell column 4N labeled #N is refreshed.

When write/read operation of the image data $D_{in}$ and $D_{out}$ of one horizontal scanning period and the refresh operation of data are completed, the chip enable signal CE is set to low level. The image memory according to this embodiment can memorize up to 1024 image data per one horizontal scanning period. Subsequently, the column counter 58a counts up by one and its count value becomes "1". Thus, the column address counter 58 outputs a write select signal for selecting the memory cell column 42 labeled #2 to the write column selector 56, outputs a read select signal for selecting the memory cell groups 43 of column #3 to the read column selector 60, and outputs a refresh signal for selecting memory cell column 4(N+1) labeled #N+1. As a result, the write enable signal WE of the memory cell column 41 labeled #1 changes to low level and the write enable signal WE of the memory cell column 42 labeled #2 shifts to high level. Further, the read enable signal RE of the memory cell column 42 labeled #2 becomes low level and the read enable signal RE of the memory cell column 43 labeled #3 becomes high level. In addition, the refresh signal Ref of the memory cell column 4N labeled #N becomes low level and the refresh signal Ref of the memory cell column 4(N+1) labeled #N+1 becomes high level.

When the chip enable signal CE becomes high level, the write/read operation of the image data $D_{in}$ and $D_{out}$ of the next horizontal scanning period and the refresh operation of data corresponding thereto are initiated. Thus, image data $D_{in}$ is written into the memory cell column 42 labeled #2, image data $D_{out}$ is read from the memory cell column 43 labeled #3, and the memory cell column 4(N+1) labeled #N+1 is refreshed. When the write/read operation of the image data $D_{in}$ and $D_{out}$ and the refresh operation of the data are completed, the chip enable signal CE becomes low level and a count value of the column counter 58a becomes "2". Then, image data $D_{in}$ is written into the memory cell column 43 labeled #3, image data Dout is read from the memory cell column 44 labeled #4, and the memory cell column 4(N+2) labeled #N+2 is refreshed. In a manner similar to the above, as shown in FIG. 8, image data $D_{in}$ are sequentially written into the memory cell columns 41 to 4M, and at the same time image data $D_{out}$ are read from the memory cell columns 41 to 4M and the memory cell columns 41 to 4M are sequentially refreshed.

As stated above, the image memory according to the second embodiment can perform not only the write/read operation of the image data but also the refresh operation thereof at the same time. Particularly, by selecting a memory cell column subject to refresh operation as in this embodiment, even when write or read cycle is longer than the maximum refresh cycle, there is no possibility that the content of the dynamic memory is vanished.

In the above-mentioned embodiment, refresh operation is initiated from the N-th memory cell column 4N which is half of the M memory cell columns. In addition, refresh operation may be applied to any memory cell group except for the memory cell column being written and the memory cell column being read.

THIRD PREFERRED EMBODIMENT

Figure 9:
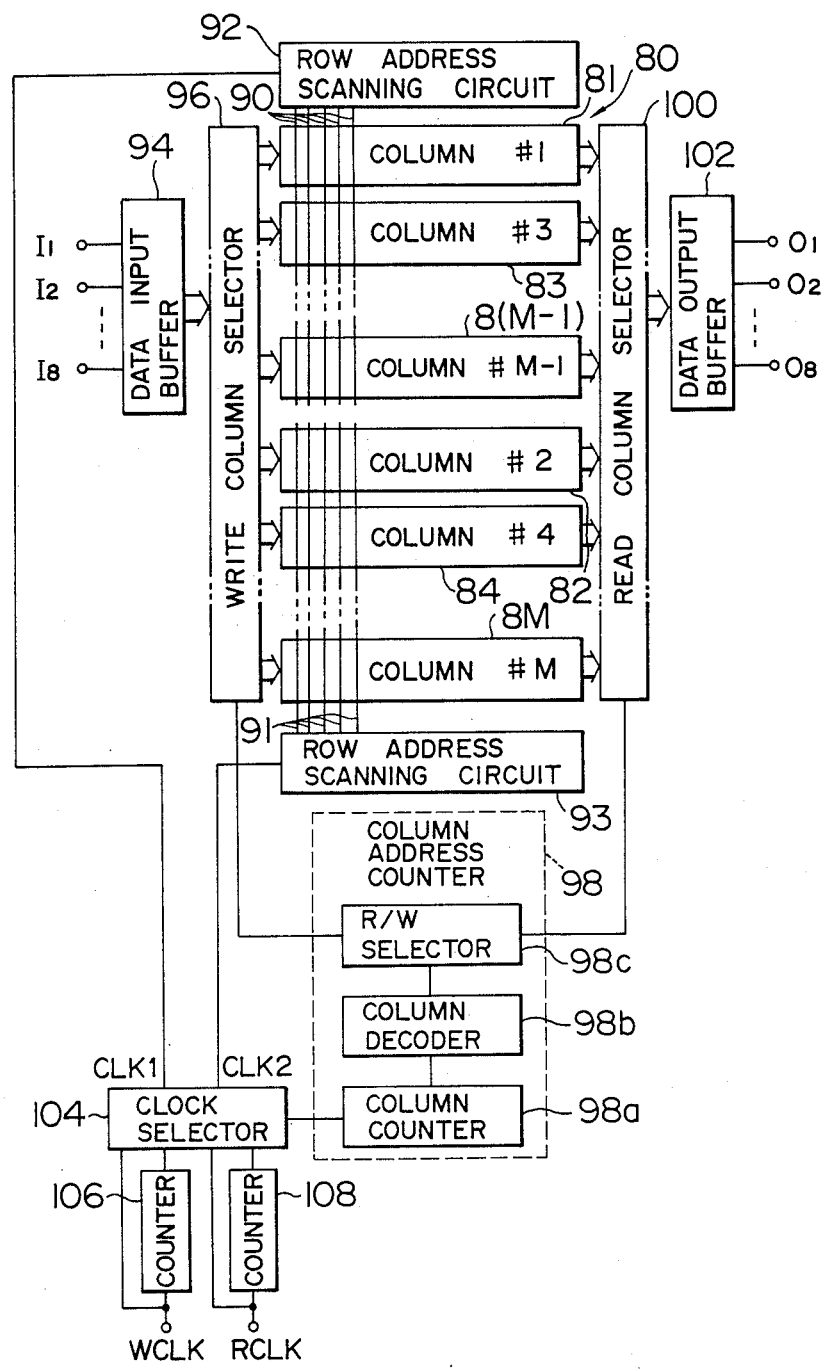
FIG. 9 is a block diagram illustrating a third preferred embodiment of an image memory according to the present invention.

A third preferred embodiment of an image memory according to the present invention is shown in FIG. 9. The image memory in this embodiment is provided with a memory cell array 80 divided into M memory cell columns 81 to 8M. Respective memory cell columns 81 to 8M have a matrix configuration having 8 columns and 1024 rows. These memory cell columns 81 are divided into odd memory cell columns 81, 83, . . . , 8(M−1) and even memory cell columns 82, 84, . . . , 8M. In this embodiment, memory cells in respective rows of the odd memory cell columns 81, 83, . . . , 8(M−1) are connected by common 1,024 word lines 90. Likewise, memory cells in respective rows of the even memory cell columns 82, 84, . . . , 8M are connected by other common 1,024 word lines 91. These word lines 90 and 91 are connected to row address scanning circuits 92 and 93, respectively. The row address scanning circuit 93 excites the word lines 90 in sequence in synchronism with a clock signal from a clock selector 104 to apply scanning operation to memory cells of the respective memory cell columns 81, 83, . . . , 8(M−1). Similarly, the row address scanning circuit 93 excites the word lines 92 in sequence in synchronism with a clock signal CLK2 from the clock selector 104 to scan memory cells of the respective memory cell columns 82, 84, . . . 8M.

These row address scanning circuits 92 and 93 have the same circuit configuration as the above-mentioned first embodiment.

Input terminals $I_1$ to $I_8$ for image data are connected to a data input buffer 94. The data input buffer 94 amplifies an image data signal having 8 bits input from the input terminals $8_1$ to $I_8$ so that its signal level becomes a write enable level to output the image data signal thus amplified. The data input buffer 94 is connected to a write column selector 96. The write column selector 96 responds to a write select signal from a column address counter 98 to select a memory cell column to be written from the memory cell columns 84 to 8M to write image data from the data input buffer 94 into the memory cell column thus selected. The column address counter 98 outputs a write select signal for selecting the odd memory cell columns 81 to 8(M−1) or the even memory cell columns 82 to 8M by turns per each horizontal scanning period.

A read column selector 100 connected to the respective memory cell columns 81 to 8M functions as not only a selector but also a sense amplifier. The read column selector 100 responds to a read select signal from the column address counter 98 to select one of the memory cell columns 81 to 8M to read image data from the memory cell column thus selected. When a write select signal is output with respect to the odd memory cell columns 81 to 8(M−1), the column address counter 98 outputs a read select signal to one of the even memory cell columns 82 to 8M, while when a write select signal is output with respect to the even memory cell columns 82 to 8M, the column address counter 98 outputs a read select signal to one of the odd memory cell columns 81 to 8(M−1). The above-mentioned read column selector 100 is connected to a data output buffer 102. The data output buffer 102 amplifies an image data signal from the read column selector 100 to output the image data signal thus amplified from output terminals $0_1$ to $0_8$.

A write clock signal WCLK is counted by a write clock counter 106 and its count value is input to the clock selector 104. In addition, a read clock signal RCLK is counted by a read clock counter 108 and its count value is also input to the clock selector 104. The clock selector 104 selectively switches the write clock signal WCLK and the read clock signal RCLK on the basis of count values from the write clock counter 106 and the read clock counter 108 to output first and second clock signals CLK1 and CLK2 to the row address scanning circuits 92 and 93, respectively. In the case where the write column selector 96 selects the odd memory cell columns 81 to 8(M−1) and the read column selector 100 selects the even memory cell columns 82 to 8M, the clock selector 104 selects the write clock signal WCLK as the clock signal CLK1 and selects the read clock signal RCLK as the clock signal CLK2. In contrast, in the case where the write column selector 96 selects odd memory cell columns 82 to 8M and the read column selector 100 selects odd memory cell columns 81 to 8(M−1), the clock selector 104 selects the read clock signal RCLK as the clock signal CLK1 and selects the write clock signal WCLK as the clock signal CLK2.

The column address counter 98 comprises a column counter 98a, a column decoder 98b, and an R/W selector 98c. The column counter 98a counts a clock switching pulse from the clock selector 104. A count value of the column counter 98a is decoded by the column decoder 98b. The R/W selector 98c responds to a decode signal from the column decoder 98b to output a write select signal to the write column selector 96 and to output a read select signal to the read column selector 100.

Figures 10, 11:
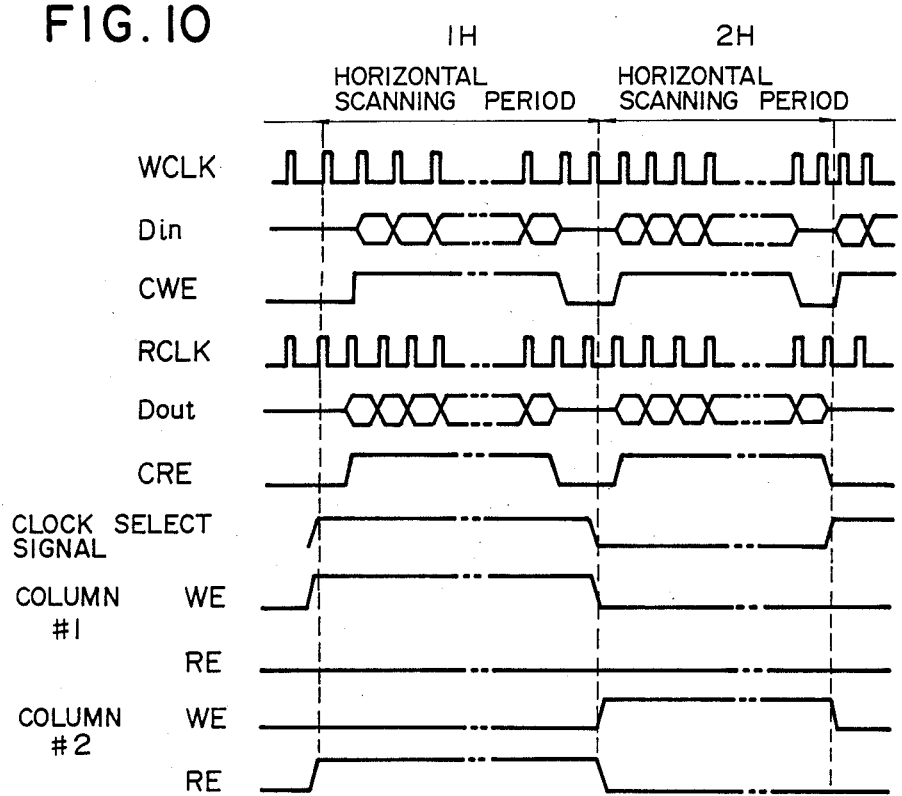
FIGS. 10 and 11 are a timechart and a table showing the operation of the image memory shown in FIG. 9, respectively.

The operation of the image memory according to the third embodiment will be described with reference to FIGS. 10 and 11. In this embodiment, the write clock signal WCLK is not the same as the read clock signal RCLK. This occurs in the following case. When image data to be written is input from an external equipment (e.g. VTR etc.), the cycle of the write clock signal WCLK often changes so that it is prolonged or shortened. In contrast, the read clock signal RCLK has a precisely fixed period because it is produced from the image memory.

Initially, the column counter 982 is reset and its count value becomes "0". When the count value of the column counter 98a is equal to "0", the R/W selector 98c outputs a write select signal for selecting the memory cell column 81 labeled #1 to the write column selector 96, and outputs a read select signal for selecting the memory cell column 82 of labeled #2 to the read column selector 100. Thus the write enable signal WE of the memory cell column 81 labeled #1 becomes high level and the read enable signal RE of the memory cell column 82 labeled #2 also becomes high level. Further, the clock selector 104 is reset and a clock select signal becomes high level. As a result, the write clock signal WCLK is output as the clock signal CLK1 and a read clock signal RCLK is output as the clock signal CLK2. On the other hand, the row address scanning circuits 92 and 93 are also reset, thus allowing the word line 90 of the first row to be excited.

When the chip write enable signal CWE becomes high level in synchronism with the write clock signal WCLK, image data $D_{in}$ of 8 bits is input from the input terminals $I_1$ to $I_8$. This image data $D_{in}$ is written into a memory cell of the first row provided in the memory cell column 81 labeled #1 through the data input buffer 94 and the write column selector 96 in synchronism with the write clock signal WCK input to the row address scanning circuit 92. Further, when the chip read enable signal CRE becomes high level in synchronism with the read clock signal RCLK, image data $D_{out}$ of 8 bits is read from the memory cell of the first row provided in the memory cell column 82 labeled #2 in synchronism with the read clock signal RCLK input to the row address scanning circuit 93. The image data $D_{out}$ thus read is output from output terminals $O_1$ to $O_8$ of the data output buffer 102 through the read column selector 100. Subsequently, scanning operation is applied to the memory cell column 81 labeled #1 in synchronism with the clock signal CLK1 (the write clock signal WCLK), so that the image data $D_{in}$ is written thereinto. Simultaneously with this, scanning operation is applied to the memory cell column 82 labeled #2 in synchronism with the clock signal CLK2 (the read clock signal RCLK), so that the image data $D_{out}$ is read therefrom.

When the write operation of the image data $D_{in}$ of one horizontal scanning period is completed, the chip write enable signal CWE is set to low level. Further, when the read operation of the image data $D_{out}$ is completed, the chip read enable signal CRE is set to low level. After both the chip write enable signal CWE and the chip read enable signal CRE become low level, the clock select signal becomes low level. The clock selector 104 outputs the read clock signal RCLK as the clock signal CLK1, and outputs the write clock signal WCLK as the clock signal CLK2. When the level of the clock select signal varies, the column counter 98a counts up by one and its count value becomes "1". Thus, the column address counter 98 outputs a write select signal for selecting the memory cell column 82 labeled #2 to the write column selector 96, and outputs a read select signal for selecting the memory cell column 83 labeled #3 to the read column selector 100. As a result, the write enable signal WE of the memory cell column 81 labeled #1 changes to low level and the write enable signal WE of the memory cell column 82 labeled #2 becomes high level. In addition, the read enable signal RE of the memory cell column 82 labeled #2 becomes low level and the read enable signal RE of the memory cell column 83 labeled #3 becomes high level.

When the chip write enable signal CWE becomes high level, the write operation of the image data $D_{in}$ of the next horizontal scanning period is initiated. Thus, the image data $D_{in}$ is written into the memory cell column 82 labeled #2. When the chip write enable signal CRE becomes high level, the read operation of the image data $D_{out}$ of the next horizontal scanning period is initiated. Thus, the image data $D_{out}$ is read from the memory cell column 83 labeled #3. When the write and read operations of the image data $D_{in}$ and $D_{out}$ are completed, both the chip write enable signal CWE and the chip read enable signal CRE become low level, and the clock select signal shifts from low level to high level. As a result, the count value of the column counter 58a becomes "2". Then, image data $D_{in}$ is written into the memory cell column 83 labeled #3 and image data $D_{out}$ is read from the memory cell column 84 labeled #4. In a manner similar to the above, as shown in FIG. 11, image data $D_{in}$ are sequentially written into the memory cell columns 81 to 8M, and at the same time image data $D_{out}$ are read from the memory cell columns 81 to 8M in synchronism with the read clock signal RCLK.

As stated above, the image memory according to the third embodiment can perform write and read operations of image data at the same time even when the write clock signal is different from the read clock signal.

Then, other operations of the present embodiment will be described with reference to FIGS. 12 and 13. One frame of the television image comprises an odd field comprising odd scanning lines and an even field comprising even scanning lines. Accordingly, when solely a single field is memorized into the image memory, the number of scanning lines is one half of the one frame of the television image. To avoid this inconvenience, there is known the non-interace scanning system to read twice the image memory in which one field is memorized, thereby to reproduce the television image of one frame.

Figures 12, 13:
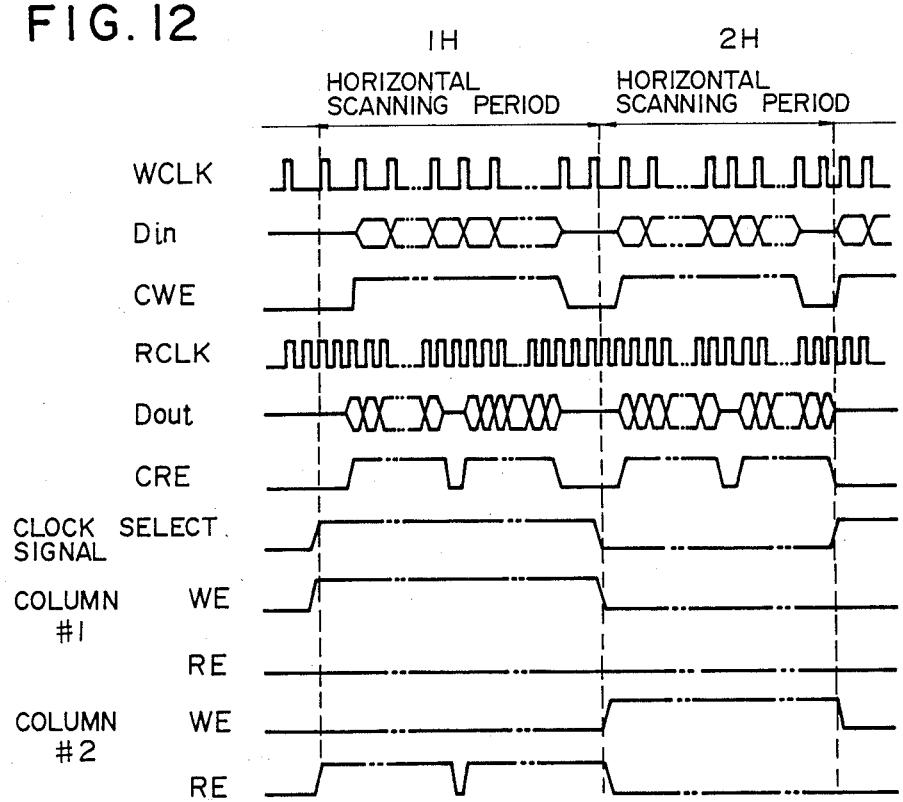
FIGS. 12 and 13 are a timechart and a table showing other operation of the image memory shown in FIG. 9, respectively.

FIGS. 12 and 13 show the operation of the non-interace system. This system differs from the system shown in FIGS. 10 and 11 in that the same image data is read twice while image data is written once. For this reason, the read clock signal has a frequency two times larger than that of the write clock signal.

Initially, when the column counter 98a is reset and its count value represents "0", the write column selector 96 responds to the write signal from the R/W selector 98c to select the memory column labeled #1 and the read column selector 100 responds to the read signal to select the memory cell column 82 labeled #2. Further, the clock selector 104 is reset and the clock select signal becomes high level. Thus, the write clock signal WCLK is output as the clock signal CLK1 and the read clock signal is output as the clock signal CLK2.

When the chip enable signal CWE becomes high level in synchronism with the write clock signal WCLK, image data $D_{in}$ having 8 bits is input from the input terminals $I_1$ to $I_8$. This image data $D_{in}$ is written into memory cells of the memory cell column 81 labeled #1 through the data input buffer 94 and the write column selector 96 in synchronism with the write clock signal WCK. Further, when the read enable signal CRE becomes high level in synchronism with the read clock signal RCLK, image data having 8 bits is read from memory cells of the memory cell column 82 labeled #2 in synchronism with the read clock signal RCLK. The image data $D_{out}$ thus read is output from the output terminals $O_1$ to $O_8$ of the data output buffer 102 through the read column selector 100.

The read clock signal RCLK has a frequency two times larger than that of the write clock signal WCLK. Accordingly, while image data $D_{in}$ is written once into memory cells of the memory cell column 81 labeled #1 during one horizontal scanning period, image data $D_{out}$ is read twice from memory cells of the memory cell column 82 labeled #2. Namely, the chip read enable signal CRE is output twice during one horizontal scanning period.

As stated above, this embodiment can perform read operation of image data of one frame based on the non-interace scanning system simultaneously with write operation of image data of one field.

In the above-mentioned embodiment, a write amplifier for writing image data is assembled into the data input buffer 94. In addition, the write amplifier may be independently provided between the write column selector 96 and the memory cell columns 81 to 8M, or between the data input buffer 94 and the write column selector 96.

In the above-mentioned embodiment, a sense amplifier for reading the image data is assembled into the read column selector 100. In addition, the sense amplifier may be independently provided between the memory cell columns 81 to 8M and the read column selector 60, or between the read column selector 100 and the data output buffer 102.

Further, each memory cell constituting the memory cell array 80 may be of dynamic or static type. In the case of the dynamic memory, refresh operation is required every fixed cycle. The setting is made such that the write/read cycle is shorter than the refresh cycle, thus making it possible to eliminate the necessity of a special refresh operation.

In addition, write/read operation is applied in sequence to memory cell groups as shown in FIG. 5 in the above-mentioned embodiment, but may be applied thereto in another order.

A FOURTH PREFERRED EMBODIMENT

Figure 14:
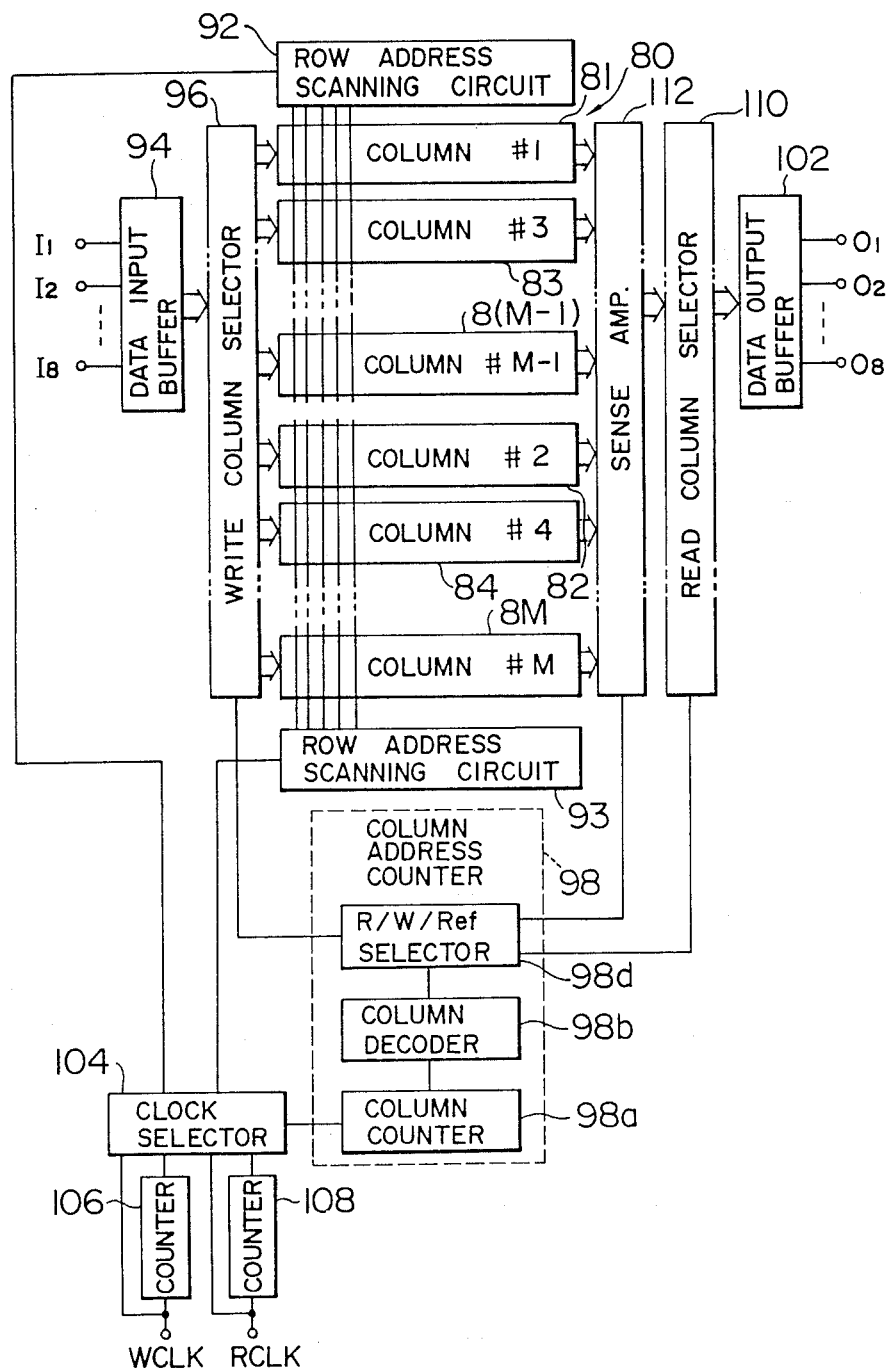
FIG. 14 is a block diagram illustrating a fourth preferred embodiment of an image memory according to the present invention.

A fourth preferred embodiment of an image memory according to the present invention is shown in FIG. 14. This embodiment differs from the third embodiment shown in FIG. 9 in that an R/W/Ref selector 98d is provided instead of the R/W selector 98c of the column address counter 98. The R/W/Ref selector 98d outputs not only read and write select signals but also a refresh select signal to select a memory cell column subject to refresh operation. The read select signal from the R/W/Ref selector 98d is output to a read column selector 110 and the write select signal therefrom is output to the write column selector 96. In addition, the refresh select signal is output to a sense amplifier 112 provided between the read column selector 110 and the memory cell columns 81 to 8M. Refresh operation is performed by writing image data, which is obtained by allowing the sense amplifier 112 to sense and amplify image data read from a memory cell of a memory cell column selected by the refresh select signal, into the selected memory cell column for a second time.

The operation of the fourth embodiment will be described with reference to FIG. 15. The write and read operations of image data $D_{in}$ and $D_{out}$ in this embodiment are the same as those in the above-mentioned third embodiment, but differ from the latter in that refresh operation of memory cell columns is further carried out simultaneously with the write and read operations. Namely, during a first horizontal scanning period 1H, image data $D_{in}$ is written into the memory cell column 81 labeled #1 and image data $D_{out}$ is read from the memory cell column 82 labeled #2. At the same time, refresh operation is applied to a memory cell column 8K labeled #K among odd memory cell columns 81 to 8(M−1). During the next horizontal scanning period 2H, image data $D_{in}$ is written into the memory cell column 82 labeled #2 and image data $D_{out}$ is read from the memory cell column 83 labeled #3. At the same time, refresh operation is applied to a memory cell column 8L labeled #L among the even memory cell columns 82 to 8M. In a manner similar to the above, as shown in FIG. 15, image data are sequentially written into the memory cell columns 81 to 8M, and at the same time image data $D_{out}$ are read from the memory cell columns 81 to 8M and the refresh operation is applied to the memory cell columns 81 to 8M.

The image memory according to the fourth embodiment can perform not only write and read operations of image data but also refresh operation thereof at the same time. Particularly, by selecting a memory cell column subject to refresh operation as in this embodiment, even when the write or read cycle is longer than the refresh cycle, there is no possibility that the contents of the dynamic memory vanish.

In the above-mentioned embodiment, refresh operation is initiated from the K-th memory cell column 8K of the memory cell columns. In addition, refresh operation may be applied to any memory cell column except for the one being written and the one being read.

As understood from the foregoing description, the image memory according to the present invention effects read and write operations of image data at the same time, thus enabling high speed operation. Further, the image memory of the invention does not need S/P or P/S converter, thus making it possible to reduce an area of peripheral circuitry. In addition, the image memory of the invention can easily change bit configuration solely by changing the number of memory cells arranged in each row of the memory cell column.

Since the memory according to the present invention is exclusively used for the image memory, random access operation is not required, resulting in elimination of peripheral circuits e.g. an address decoder etc. Further, since slight lacking in bits is permissible in the case of the image memory, capacity when used as a dynamic memory can be reduced. Accordingly, this makes it possible to provide high speed and high density packaging.

FIFTH PREFERRED EMBODIMENT

Figure 16:
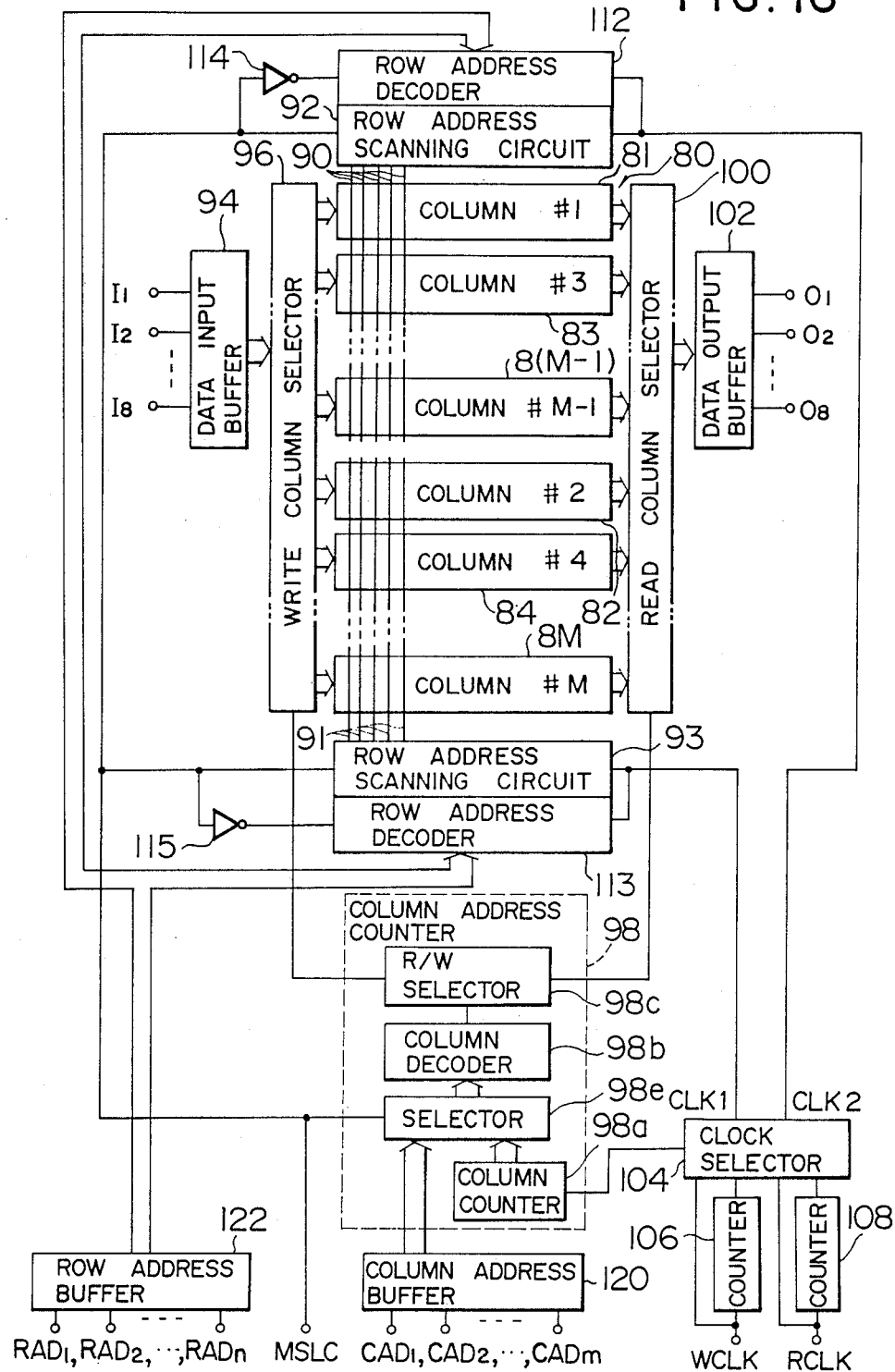
FIG. 16 is a block diagram illustrating a fifth preferred embodiment of an image memory according to the present invention.

A fifth preferred embodiment of an image memory according to the present invention is shown in FIG. 16. The fifth embodiment differs from the third embodiment shown in FIG. 9 in that there is provided a function to write image data into memory cells designated by column addresses $CAD_1$, $CAD_2$, ..., $CAD_m$ and row addresses $RAD_1$, $RAD_2$, ... $RAD_n$ which are input from the external.

For realizing this function, a row address decoder 112 is provided in addition to the row address scanning circuit 92 for scanning memory cells provided in the memory cell columns 81, 83, ..., 8(M−1) of the first group, and a row address decoder 113 is provided in addition to the row address scanning circuit 93 for scanning memory cells provided in the memory cell columns 82, 84, ..., 8M of the second group. The row address decoder 112 functions to decode row addresses $RAD_1$, $CAD_2$ ..., $RAD_m$ which are input from the external to select one of the word lines 90, thus allowing the selected word line to be active. Similarly, the row address decoder 113 functions to decode row addresses $RAD_1$, $RAD_2$ ..., $RAD_n$ which are input from the external to select one of the word lines 91, thus allowing the selected word line to be active. These row addresses $RAD_1$, $RAD_2$, ..., $RAD_n$ are amplified by the row address buffer 122 and then are input to the row address decoders 112 and 113.

The selection of whether the row address scanning circuits 92 and 93 or the row address decoders 112 and 113 are caused to be active is made depending upon logical state of a mode select signal MSLC by using inverters 114 and 115. Namely, when the mode select signal MSLC is in a scan mode, the row address scanning circuits 92 and 93 are selected, while when the mode select signal MSLC is in a random mode for allowing image data at a location externally designated, the row address decoders 112 and 113 are selected.

Further, the column address counter 98 is provided with a selector 98e for selecting either of count values of the column counter 98a and addresses $CAD_1$, $CAD_2$, ..., $CAD_m$ in accordance with the mode select signal MSLC. The column addresses $CAD_1$, $CAD_2$, ..., $CAD_m$ are amplified by the column address buffer 120 and then are input to the selector 98e.

When the mode select signal MSLC is in the scan mode, the count values of the column counter 98d are selected and the selected count values are input to the column decoder 98b. In contrast, when the mode select signal MSLC is in the random mode, the column addresses $CAD_1$, $CAD_2$, ..., $CAD_m$ are selected and the selected addresses are input to the column decoder 98b.

The operation of the image memory according to the fifth embodiment will be described. When the mode select signal MSLC is in the scan mode the row address scanning circuits 92 and 93 are selected and the selector 98e selects the column counter 98. Accordingly, the image memory in this embodiment operates in the same manner as in the embodiment shown in FIG. 9. On the other hand, when the mode select signal is in the random mode, the row decoders 112 and 113 are selected and the selector 98e selects the column addresses $CAD_1$, $CAD_2$, ..., $CAD_m$. Accordingly, by sequentially changing, in synchronism with the write clock WCLK, the row addresses $RAD_1$, $RAD_2$, ..., $RAD_n$ and the column addresses $CAD_1$, $CAD_2$, ..., $CAD_m$ at which image data $D_{in}$ in memory cells determined by the row addresses $RAD_1$, $RAD_2$, ..., $RAD_n$ within the memory cell column determined by the column addresses $CAD_1$, $CAD_2$, ..., $CAD_m$, image data are written in sequence into memory cells designated within the memory cell array.

Thus, the image memory according to this embodiment can rewrite an arbitrary area within one image.

In this embodiment, image data may be read on the basis of the non-interace system in the same manner as in the third embodiment.

In addition, in this embodiment, there may be provided an R/W/Ref selector 98d instead of the R/W selector 98c to effect not only the write and read operations but also the refresh operation at the same time.

SIXTH PREFERRED EMBODIMENT

Figure 17:
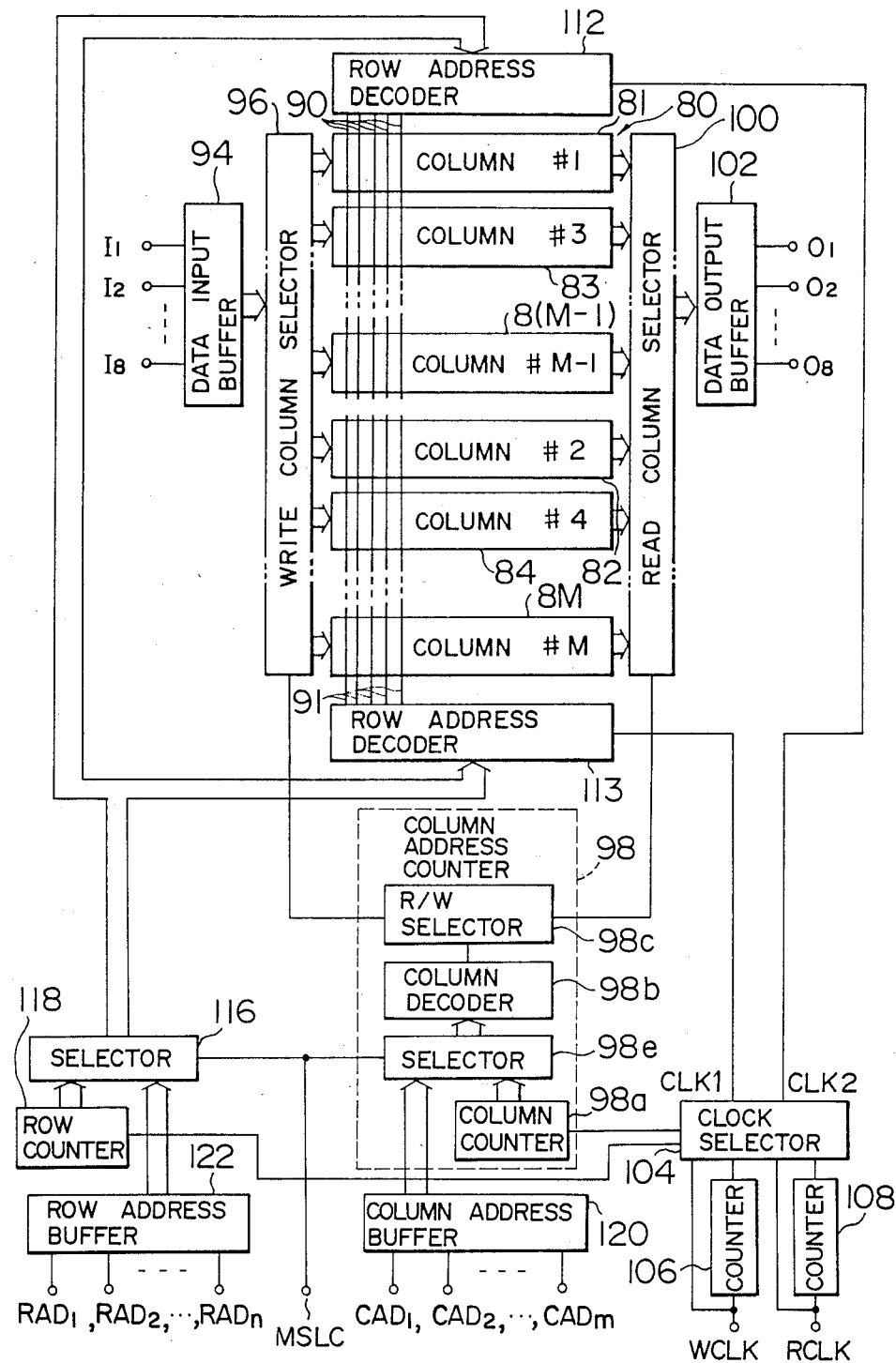
FIG. 17 is a block diagram illustrating a sixth preferred embodiment of an image memory according to the present invention.
Figure 18:
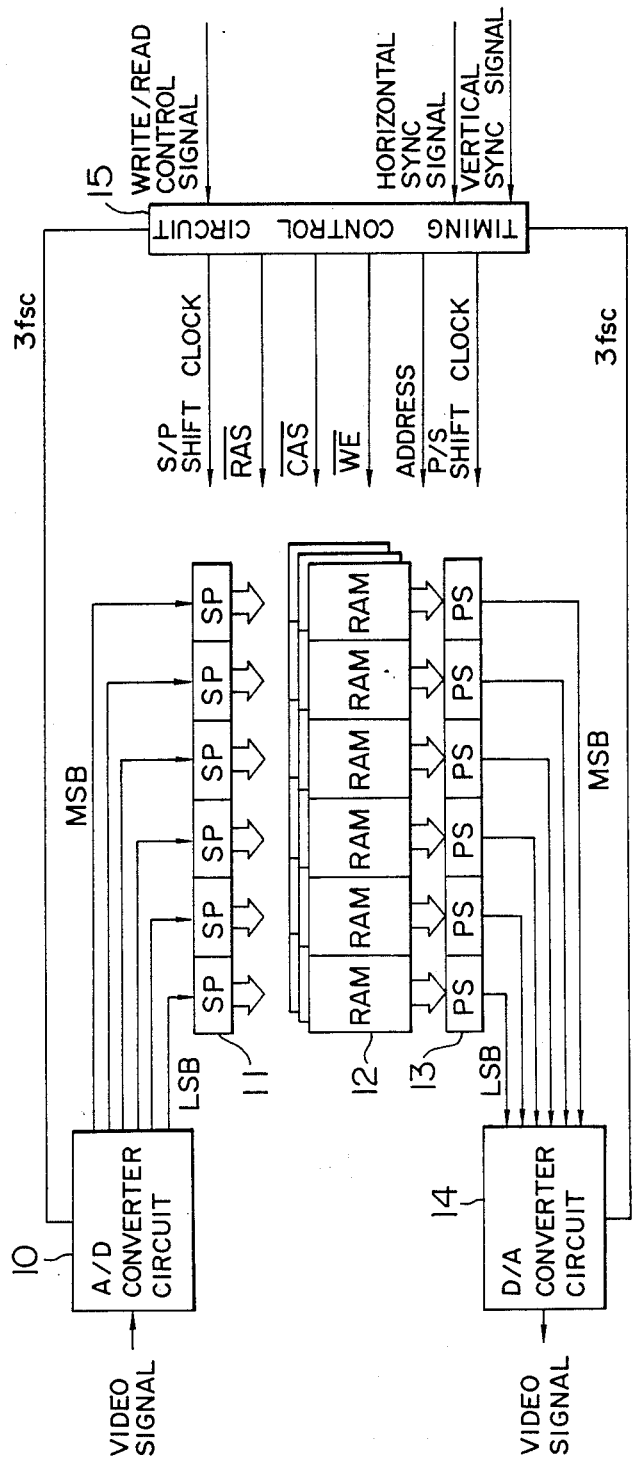
FIGS. 18 and 19 are block diagrams illustrating conventional image memories, respectively.
Figure 19:
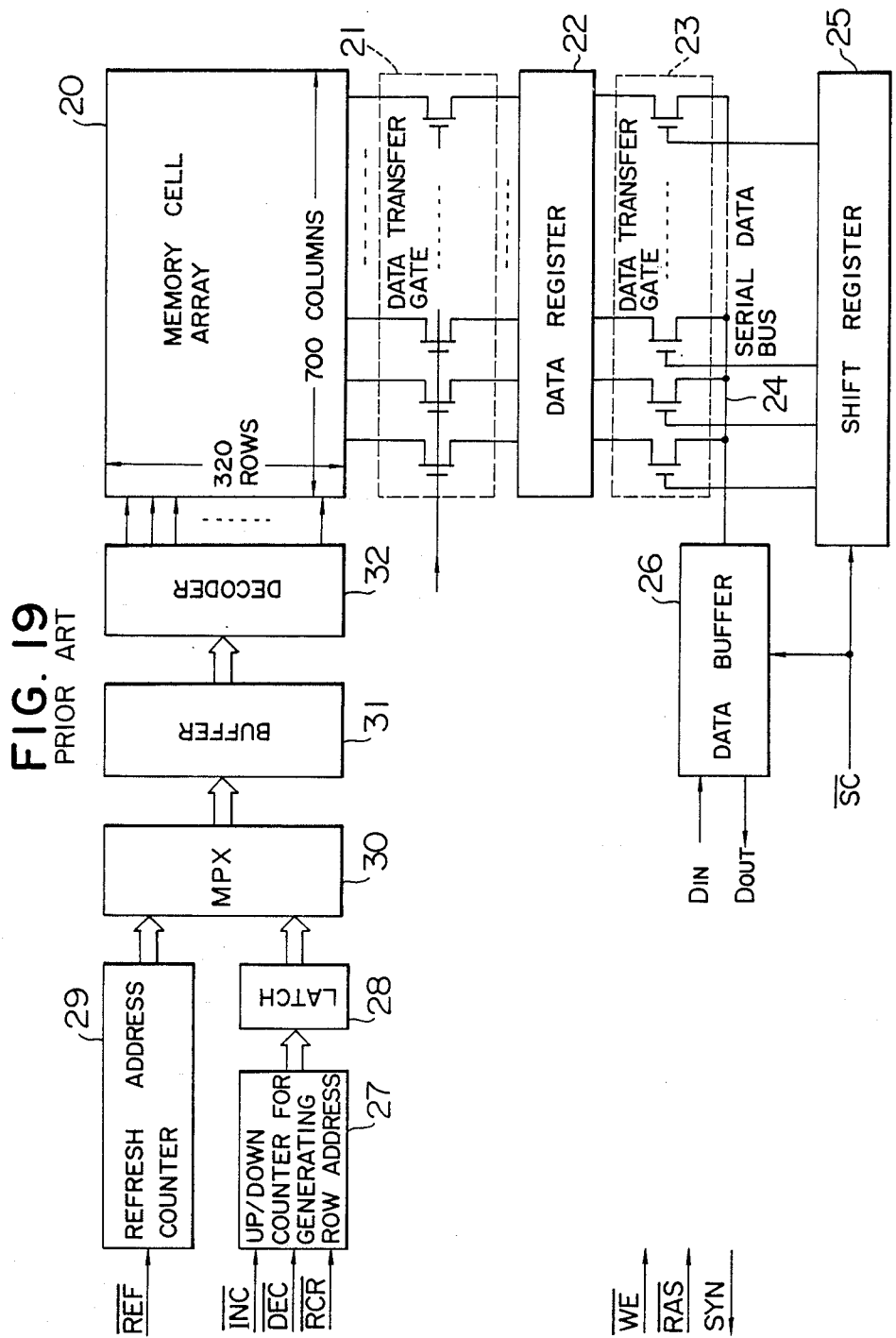

A sixth preferred embodiment of an image memory according to the present invention is shown in FIG. 17. This embodiment is characterized in that image memory can be written into a memory cell arbitrarily designated in a manner similar to the fifth embodiment, and differs from the fifth embodiment in that solely the row address decoders 112 and 113 are provided without provision of the row address scan circuits 92 and 93 for allowing the common word lines to be active.

The row counter 118 counts the clock signal WCLK or the read clock signal RCLK from the clock selector 104. The counter 118 selects, on the basis of the mode select signal MSLC, either of count values from the row counter 118 and the row addresses $RAD_1, RAD_2, \ldots, RAD_n$ input through the row address buffer 122 to output the selected ones to the row address decoders 112 and 113 as row address signals.

When the mode select signal MSLC is in the scan mode, the selector 116 selects count values from the row counter 118. Accordingly, a count value which successively increases by one from zero is input to the row address decoders 112 and 113. As a result, the common word lines 90 and 91 are excited and subjected to scanning operation one by one. When the mode select signal MLSC is in the random mode, the selector 116 selects row addresses $RAD_1, RAD_2, \ldots, RAD_n$ from the row address buffer 112. Accordingly, the designated common word line 90 is excited.

The operation of the image memory according to the sixth embodiment will be described. When the mode select signal MSLC is in the scan mode, the selector 116 selects the row counter 118 and the selector 98e selects the counter 98a. Accordingly, the image memory according to this embodiment operates in the same manner as in the embodiment shown in FIG. 9. On the other hand, when the mode select signal is in the random mode, the selector 116 selects the row address buffer 122 and the selector 98e selects the column addresses $CAD_1, CAD_2, \ldots CAD_m$. Accordingly, sequentially changing, in synchronism with the write clock WCLK, the row addresses $CAD_1, RAD_2, \ldots, RAD_n$ and the column addresses $CAD_1, CAD_2, \ldots, CAD_m$ at which input image data $D_{in}$ are written in synchronism with the write clock WCLK, image data are sequentially written into memory cells designated within the memory cell array.

Thus, the image memory according to this embodiment can rewrite an arbitrary area within one image.

In this embodiment, image data may be read on the basis of the non-interace system in the same manner as in the third embodiment.

In addition, in this embodiment, there may be provided an R/W/Ref selector 98d instead of the R/W selector 98c to effect not only the write and read operations by also the refresh operation at the same time.

The image memory according to the present invention is applicable to various technical fields e.g. VTR, digital television, teletext, CATV, TV conference, facsimile, videotex, personal computer, word processor, CAD/CAM, etc.

What is claimed is:

1. An image memory for writing image data thereinto and reading it therefrom comprising:
    (a) a plurality of memory cell columns, each of the columns comprising a plurality of memory cells, for memorizing image data having a predetermined number of bits;
    (b) common word lines for connecting memory cells in a same row of said memory cell columns;
    (c) scanning means for sequentially designating memory cells of said memory cell columns on the basis of a scanning operation synchronous with a clock signal transferred through said common word lines;
    (d) a column address counter for counting said clock signal to output a column address signal;
    (e) a write column selector for selecting a memory cell column into which image data is written on the basis of said column address counter;
    (f) write buffer means for writing image data into the memory cell designated by the scanning operation of said scanning means of the memory cell column selected by said write column selector;
    (g) a read column selector for selecting a memory cell column different from said memory cell column selected by said write column selector; and
    (h) read buffer means for reading image data from the memory cell designated by the scanning operation of said scanning means of the memory cell column selected by said read column selector.

2. An image memory as set forth in claim 1, wherein said image memory further comprises refresh means for refreshing at least one of the memory cell columns which are different from the memory cell column selected by said write column selector and the memory cell column selected by said read column selector.

3. An image memory as set forth in claim 1, wherein said column address counter comprises a shift register which shifts synchronous with an input clock signal.

4. An image memory as set forth in claim 1, wherein said column address counter comprises a counter for counting said clock signal, and a decoder for decoding a count value of said counter.

5. An image memory for writing image data thereinto and reading it therefrom comprising:
    (a) a plurality of memory cell columns, each column comprising a plurality of memory cells, for memorizing image data having a predetermined number of bits;
    (b) a first group of common word lines for connecting memory cells in a same row of said memory cell columns belonging to the first group;
    (c) first scanning means for sequentially designating memory cells of said memory cell columns belonging to said firsts group on the basis of the scanning operation synchronous with the first clock signal transferred through said first group of common word lines;
    (d) a second group of common word lines for connecting memory cells in a same row of said memory cell columns belonging to a second group;
    (e) second scanning means for sequentially designating memory cells of said memory cell columns belonging to said second group on the basis of the scanning operation synchronous with a second clock signal transferred through said second group of common word lines;
    (f) a column address counter for counting at least one of said first and second clock signals to output a column address signal;
    (g) a write column selector for selecting a memory cell column into which image data is written on the basis of said column address signal;
    (h) write buffer means for writing image data into a memory cell of said memory cell column selected by said write column selector;
    (i) read column selector for selecting a memory cell column belonging to a group different from said memory cell column selected by said write column selector on the basis of said column address signal;
    (j) read buffer means for reading image data from a memory cell of said memory cell column selected by said read column selector; and
    (k) clock selector means which inputs a write clock signal and a read clock signal to output said read clock signal as one of said first and second clock signal to the scanning means to select the column selected by said read column selector, and to output said write clock signal as said first or second clock signal to the scanning means to select the column selected by said write column selector.

6. An image memory as set forth in claim 5, wherein said memory cells are dynamic memory cells, said image memory further comprises refresh means for refreshing at least one of memory cell columns which is different from the memory cell column selected by said write column selector and the memory cell column selected by said write column selector.

7. An image memory as set forth in claim 5, wherein said column address counter comprises a shift register which shifts synchronous with an input clock signal.

8. An image memory as set forth in claim 5, wherein said column address counter comprises a counter for counting said clock signal, and a decoder for decoding a count value of said counter for counting said clock signal.

9. An image memory as set forth in claim 5, wherein said read clock signal has a frequency which is about twice that of said write clock signal, said read means reading the same image data twice from the memory cell column selected by said read column selector, while said write means writes image data once into the memory cell column selected by said write column selector.

10. An image memory of writing image data thereinto and reading it therefrom, comprising:
   (a) a plurality of memory cell columns, each of the columns comprising a plurality of memory cells, for memorizing image data having a predetermined number of bits;
   (b) a first group of common word lines for connecting memory cells in a same row of said memory cell columns of a first group;
   (c) first scanning means for sequentially designating memory cells of said memory cell column belonging to said first group on the basis of the scanning operation synchronous with a first clock signal transferred through said first group of common word lines;
   (d) a first row address decoder for decoding row addresses inputted from the external to select memory cells of said memory cell columns of said first group connected to one of said common word lines of said first group synchronous with said first clock signal;
   (e) first selector means for selecting one output of said first scanning means and an output of said first row address decoder on the basis of a mode select signal for selecting a write mode;
   (f) a second group of common word lines for connecting memory cells in a same row of said memory cell columns belonging to a second group;
   (g) second scanning means for sequentially designating memory cells of said memory cell columns belonging to said second group on the basis of a second signal pulse transferred through said second group of common word line;
   (h) a second row address decoder for decoding said row addresses to select memory cells belonging to said second group of memory cell columns connected to one of said second group of common word lines synchronous with said second clock signal;
   (i) second selector means for selecting either of said second scanning means and said second row address decoder on the basis of said mode select signal;
   (j) a column counter for counting at least one of said first clock signal and said second clock signal;
   (k) third selector means for selecting a count value of said column counter and one of column addresses inputted from the external as a column address signal on the basis of said mode select signal;
   (l) a write column selector for selecting a memory cell column into which image data is written on the basis of said column address selected by said third selector means;
   (m) write buffer means for writing image data into a memory cells of said memory cell column selected by said write column selector;
   (n) a read column selector for selecting a memory cell column belonging to a group different from said memory cell column selected by said write column selector on the basis of said column address signal by said third selector means;
   (o) read buffer means for reading image data from the memory cells of said memory cell column selected by said read column selector; and
   (p) clock selector means which inputs a write clock signal and a read clock signal to output said read clock signal as one of said first and second clock signal to scanning means of said columns elected by said read column selector, and to output said write clock signal as one of said first and second clock signal to scanning means of said column selected by said write column selector.

11. An image memory as set forth in claim 10, wherein said image memory further comprising refresh means for refreshing at least one of memory cell columns which is different from the memory cell column selected by said write column selector and the memory cell column selected by said read column selector.

12. An image memory as set forth in claim 10, wherein said read clock signal has a frequency which is about twice that of said write clock signal, said read means reading the same image data twice from the memory cell column selected by said read column selector, while said write means writes image data once into the memory cell column selected by said write column selector.

13. An image memory as set forth in claim 10, wherein said read clock signal has a frequency which is about twice that of said write clock signal, said read means reading the same image data twice from the memory cell column selected by said read column selector, while said write means writes image data once into said selected memory cell column selected by said write column selector.

14. An image memory of writing image data thereinto and reading it therefrom, comprising:
   (a) a plurality of memory cell columns, each of the columns comprising a plurality of memory cells, for memorizing image data having a predetermined number of bits;
   (b) a first group of common word lines for connecting memory cells in a same row of said memory cell columns belonging to a first group;
   (c) a first row address decoder for decoding a row address signal to select memory cells of said memory cell columns of said first group connected to one of said common words lines of said first group synchronous with a first clock signal;

(d) a second group of common word lines for connecting memory cells in a same row of said memory cell columns belonging to a second group;

(e) a second row address decoder for decoding said row address signal to select memory cells of said memory cell columns of said second group connected to one of said common word lines of said second group;

(f) a row counter for counting said first clock signal and/or said second clock signal;

(g) first selector means for selecting one of a count value of said row counter and a row address inputted from the external as said row address signal on the basis of a write mode select signal for selecting write mode;

(h) a column counter for counting at least one of said first clock signal and said second clock signals;

(i) second selector means for selecting a count value of said column counter and one of column addresses inputted from the external as a column address signal on the basis of said mode select signal;

(j) a write columns elector for selecting a memory cell column into which image data is written on the basis of the column address signal of said second selector means;

(k) write buffer means for writing image data into a memory cells of said memory cell column selected by said write column selector;

(l) read column selector for selecting a memory cell column belonging to a group different form said memory cell column selected by said write column selector;

(m) read buffer means for reading image data from the memory cell column selected by said read column selector; and (n) clock selector means which inputs a write clock signal and a read clock signal as said first or second clock signal to scanning means of said column selected by said read column selector, and to output said write clock signal as said first or second clock signal to scanning means of said column selected by said write column selector.

15. An image memory as set forth in claim 14, wherein said image memory further comprising refresh means for refreshing at least one of memory cell columns which is different from the memory cell column selected by said write column selector and the memory cell column selected by said read column selector.

16. An image memory as set forth in claim 14, wherein said read clock signal has a frequency which is about twice that of said write clock signal, said read means reading the same image data twice from the memory cell column selected by said read column selector, while said write means writes image data once into the memory cell column selected by said write column selector.

* * * * *